United States Patent
Lagoy et al.

(10) Patent No.: US 10,623,118 B2
(45) Date of Patent: Apr. 14, 2020

(54) MODULAR MULTI-CHANNEL RF CALIBRATION ARCHITECTURE FOR LINEARIZATION

(71) Applicant: BAE SYSTEMS Information and Electronic Systems Integration Inc., Nashua, NH (US)

(72) Inventors: Ryan C. Lagoy, Boston, MA (US); Gregory M. Flewelling, Freeport, ME (US); Thomas J. Johnson, Bedford, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 15/661,304

(22) Filed: Jul. 27, 2017

(65) Prior Publication Data

US 2019/0036622 A1 Jan. 31, 2019

(51) Int. Cl.
*H04B 17/11* (2015.01)
*H03F 1/32* (2006.01)
*H03F 3/21* (2006.01)
*H03F 3/19* (2006.01)
*H04L 25/03* (2006.01)
(Continued)

(52) U.S. Cl.
CPC ........... *H04B 17/11* (2015.01); *H03F 1/3241* (2013.01); *H03F 3/19* (2013.01); *H03F 3/21* (2013.01); *H03G 3/3042* (2013.01); *H04B 1/04* (2013.01); *H04B 1/0483* (2013.01); *H04L 25/03114* (2013.01); *H04L 25/03343* (2013.01); *H04L 25/03891* (2013.01); *H03F 2200/294* (2013.01); *H03F 2200/451* (2013.01); *H03G 3/3036* (2013.01); *H03G 2201/106* (2013.01); *H04B 17/12* (2015.01); *H04B 2001/0425* (2013.01)

(58) Field of Classification Search
CPC ......... H04B 17/11; H04B 1/04; H03F 1/3241; H03F 3/19; H03F 3/21; H03F 2200/451; H03G 3/3042; H03G 2201/106; H04L 25/03891
See application file for complete search history.

(56) References Cited

U.S. PATENT DOCUMENTS 8,306,149 B2 11/2012 Mujica et al.
8,498,369 B2 7/2013 Forrester et al.
(Continued)

FOREIGN PATENT DOCUMENTS

WO 2008/124347 A1 10/2008

OTHER PUBLICATIONS

D.D. Falconer, "Adaptive equilization of channel nonlinearities in QAM data transmission systems", The Bell System Technical Journal, vol. 57, No. 7, pp. 2589-2611, Sep. 1978.
(Continued)

*Primary Examiner* — Freshteh N Aghdam
(74) *Attorney, Agent, or Firm* — Davis & Bujold, PLLC; Scott J. Asmus

(57) ABSTRACT

The system and method for adaptively obtaining coefficients of an inverse model for both equalization and pre-distortion for a multi-channel and reconfigurable RF system. The system preforms real-time learning and adaption and does not require training sets. In some cases, the system learns new coefficients across time and transient changes in performance.

12 Claims, 15 Drawing Sheets

*Indirect Learning Architecture*

(51) Int. Cl.
*H04B 1/04* (2006.01)
*H03G 3/30* (2006.01)
*H04B 17/12* (2015.01)

(56) References Cited

U.S. PATENT DOCUMENTS

| | | | | |
|---|---|---|---|---|
| 9,559,808 B2* | 1/2017 | Rozenblit | ............ | H03G 3/3042 |
| 2003/0179831 A1* | 9/2003 | Gupta | ................... | H03F 1/3247 |
| | | | | 375/296 |
| 2007/0190952 A1* | 8/2007 | Waheed | ............... | H04B 1/0475 |
| | | | | 455/114.3 |
| 2008/0130789 A1* | 6/2008 | Copeland | ............. | H03F 1/3247 |
| | | | | 375/297 |
| 2010/0045375 A1* | 2/2010 | Straussmann | ....... | H03M 1/0614 |
| | | | | 330/149 |
| 2012/0120990 A1* | 5/2012 | Koren | .................. | H04B 1/0475 |
| | | | | 375/219 |
| 2013/0120062 A1* | 5/2013 | Lozhkin | ................ | H03F 1/3247 |
| | | | | 330/149 |
| 2013/0278332 A1* | 10/2013 | Ji | ......................... | H03F 1/3241 |
| | | | | 330/124 R |
| 2014/0029660 A1 | 1/2014 | Bolstad et al. | | |
| 2017/0272382 A1* | 9/2017 | Baldor | .................... | H04L 45/60 |

OTHER PUBLICATIONS

B. Miller et al., "Nonlinear equalization of RF receivers", as early as 2006.

C. Eun et al., "A new Volterra predistorter based on the indirect learning architecture", IEEE Transactions on Signal Processing, vol. 45, No. 1, pp. 223-227, Jan. 1997.

J. Chani-Cahuana et al., "A new variant of the indirect learning architecture for the linearization of power amplifiers", 2015 European Microwave Conference (EuMC), Paris, pp. 1295-1298, 2015.

J. Harmon et al., "Iterative Approach to the Indirect Learning Architecture for Baseband Digital Predistortion" 2010 IEEE Communications Society, Globecom 2010, pp. 1-5, 2010.

A.K. Bolstad, "Nonlinear Predistortion Techniques", Modern Topics in Power Amplifiers, pp. 1-20 and 23-24, Oct. 18, 2016.

Mathews, V. J., et al., "Volterra Series Expansions," Chapter 2, Polynomial Signal Processing, Copyright 2000 by John Wiley & Sons, Inc., pp. 19-63.

Mathews, V. J., et al., "Realization of Truncated Volterra Filters," Chapter 3, Polynomial Signal Processing, Copyright 2000 by John Wiley & Sons, Inc., pp. 69-90.

Mathews, V. J., et al., "Parameter Estimation," Chapter 5, Polynomial Signal Processing, Copyright 2000 by John Wiley & Sons, Inc., pp. 149-162.

Mathews, V. J., et al., "Adaptive Truncated Volterra Filters," Chapter 7, Polynomial Signal Processing, Copyright 2000 by John Wiley & Sons, Inc., pp. 239-297.

Mathews, V. J., et al., "Inversion and Time Series Analysis," Chapter 9, Polynomial Signal Processing, Copyright 2000 by John Wiley & Sons, Inc., pp. 339-359.

Mathews, V. J., et al., "Applications of Polynomial Filters," Chapter 10, Polynomial Signal Processing, Copyright 2000 by John Wiley & Sons, Inc., pp. 365-370.

Mathews, V. J., et al., "Some Related Topics and Recent Developments," Chapter 11, Polynomial Signal Processing, Copyright 2000 by John Wiley & Sons, Inc., pp. 413-414.

* cited by examiner

MODULAR MULTI-CHANNEL RF CALIBRATION ARCHITECTURE FOR LINEARIZATION

FIELD OF THE DISCLOSURE

The present disclosure relates to RF communications, defense applications and more particularly to linearization techniques and modular mixed-signal architecture used to estimate digital nonlinear pre-inverse or post-inverse filter coefficients for the equalization or pre-distortion of RF signals.

BACKGROUND OF THE DISCLOSURE

The nonlinearities intrinsic in all analog RF devices create limitations in total system performance of RF front ends. With the introduction of more advanced threats in the Electronic Warfare (EW) spectrum, these limitations are no longer acceptable. RF receivers have to become more linear, allowing for greater dynamic range, while transmitters need to put out as much power they can, without unwanted out-of-band emissions. Without modern linearization (digital equalization and pre-distortion) techniques, the performance of RF systems is likely to get outpaced by adversarial systems. Additionally, communication and radar systems may require simultaneous transmission and reception (STAR) capabilities, and in many cases, the high power transmitted signal will leak into the receiver, resulting in nonlinear operation and reduction in sensitivity. A system such as this, is also suitable for phased array applications where many elements are spaced closely together, and linearization may be needed to increase its overall sensitivity.

Previous solutions include designing more linear/higher power amplifiers and analog linearization. Analog linearization requires very sensitive hardware design, high design/implementation costs, and this technique is generally used for narrowband systems. Alternatively, one may be able to choose a higher power and more linear amplifier, but this may reduce the efficiency of the system, have greater SWAP-C (size, weight, power, and cost), and may not be technically feasible.

The present disclosure provides a modular, mixed-signal architecture that can estimate digital nonlinear pre-inverse or post-inverse filter coefficients in real-time for equalization or pre-distortion of RF signals using a multi-channel, reconfigurable hardware platform. The proposed system can be used in applications such as in congested and contested environments with high power interferers, as well as for STAR to reduce nonlinear effects due to high-power transmitted signal leakage. The system of the present disclosure can also be implemented on the same chip as the front end, or externally.

SUMMARY OF THE DISCLOSURE

One aspect of the present disclosure is a modular, multi-channel RF calibration system comprising at least two independent receive channels for use in equalization; a switch matrix configured for variable attenuation; at least one converter selected from the group consisting of digital-to-analog and analog-to-digital; and a microprocessor or FPGA configured for adaptation of nonlinear model coefficients for real-time linearization.

One embodiment of the modular, multi-channel RF calibration system is wherein the system provides IM3 suppression of greater than 10 dB and cancellation of other nonlinear distortion for equalization.

Another embodiment if the modular, multi-channel RF calibration system is wherein the system predicts the operating point of the analog system.

Another aspect of the present disclosure is a modular, multi-channel RF calibration system comprising at least one receive channel and at least one transmit channel for use in pre-distortion; a switch matrix configured for variable attenuation; at least one converter selected from the group consisting of digital-to-analog and analog-to-digital; and a microprocessor or FPGA configured for adaptation of nonlinear model coefficients for real-time linearization.

One embodiment of the modular, multi-channel RF calibration system is wherein the system provides IM3 suppression of greater than 10 dB and cancellation of other nonlinear distortion for pre-distortion.

Another embodiment of the modular, multi-channel RF calibration system is wherein the system predicts the operating point of the analog system.

Yet another aspect of the present disclosure is a modular, multi-channel RF calibration system comprising at least two independent receive channels and at least one transmit channel for use in concurrent equalization and pre-distortion; a switch matrix configured for variable attenuation; at least one converter selected from the group consisting of digital-to-analog and analog-to-digital; and a microprocessor or FPGA configured for adaptation of nonlinear model coefficients for real-time linearization.

One embodiment of the modular, multi-channel RF calibration system is wherein the system provides IM3 suppression of greater than 10 dB and cancellation of other nonlinear distortion for both equalization and pre-distortion.

Another embodiment of the modular, multi-channel RF calibration system is wherein the system predicts the operating point of the analog system.

These aspects of the disclosure are not meant to be exclusive and other features, aspects, and advantages of the present disclosure will be readily apparent to those of ordinary skill in the art when read in conjunction with the following description, appended claims, and accompanying drawings.

BRIEF DESCRIPTION OF THE DRAWINGS

The foregoing and other objects, features, and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION OF THE DISCLOSURE

Figure 1A:
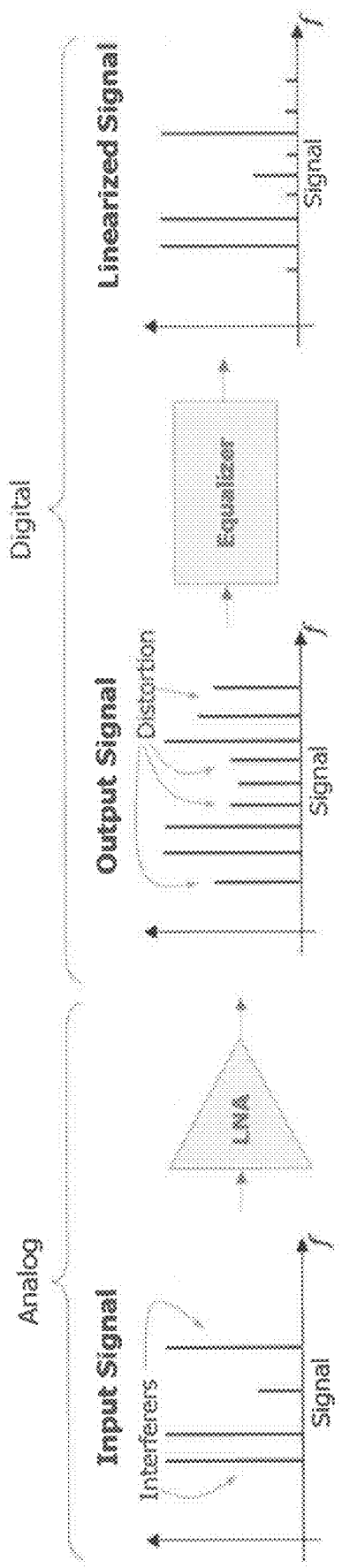
FIG. 1A depicts linearization in RF receiving, or equalization.

An RF front end, whether it is used in a receiver or a transmitter, is limited by the nonlinearities of the devices that comprise it. One of the most significant contributors of these effects are the amplifiers that are found within the chain. An amplifier can be described as having two distinct regions, linear and nonlinear. In the linear region, an amplifier's input power is approximately proportional to its output power, with the constant of proportionality defined as the gain. The amplifier operates approximately linearly at power input levels that are lower than a specified point, most commonly denoted as the input 1 dB compression point (IP1dB). The IP1dB is defined as the power of the input in which there is a 1 dB reduction in gain seen at the output. Once the input signal power surpasses this point, the amplifier begins to operate in its nonlinear or saturation region.

Although an RF front end is designed to operate in the linear region, there are common instances where it may be driven into the nonlinear region. For example, when transmitting, a high power amplifier is most efficient and offers the highest power output when it is saturated. As a second example, when receiving, a low noise amplifier at the front of the cascade may receive high power interferers within the tuned frequency band, causing distortion of the desired signal.

It is understood that there are undesirable effects caused by nonlinear operation of an amplifier. One undesirable effect is amplitude distortion, which is also referred to as amplitude modulation to amplitude modulation (AM-AM) conversion in literature. IP1 dB is one example of how to measure this effect. Another undesirable effect is phase distortion, which is also referred to as amplitude modulation to phase modulation (AM-PM) conversion. With this effect, a deviation in the phase of the signal is seen as the power of the input is increased.

These device level effects result in system level performance issues in RF front ends. Both types of distortion produce undesired spectral content in frequencies both within and outside the frequency band of interest. This is referred to as spectral regrowth. In operation, spectral growth can have negative effects, for example, the added frequencies could exceed spectral masks for transmit signals or overpower small desired signals in the receive direction. It is impossible to filter out the in-band distortion, and it is often extremely difficult to filter close-in intermodulation products, so spectral regrowth remains a real concern in system design.

Currently, several methods exist that attempt to mitigate spectral growth and they are used to increase the linearity and efficiency of RF devices. First, one can back the input power off from the saturation point of the amplifier, but this reduces the overall efficiency of the system and often reduces the signal to noise (SNR) if analog attenuation is used. Second, one can design or choose an amplifier to handle higher power inputs, which results in a larger device, higher power, lower efficiencies, higher thermal dissipation requirements, and commonly a higher cost per unit. Third, an analog approach can be taken, and this can be split into two main categories: feed-forward and Cartesian loop methods. Both of these analog options require highly linear, low-loss, and precise components to increase the efficiency and linearity of the RF device. Performance is also often reduced with loading, temperature variation, and other environmental effects. And, oftentimes, these systems only work for narrowband signal inputs. Lastly, digital linearization methods can be implemented, which aim to improve upon all of the lapses of the approaches mentioned above.

Figure 1B:
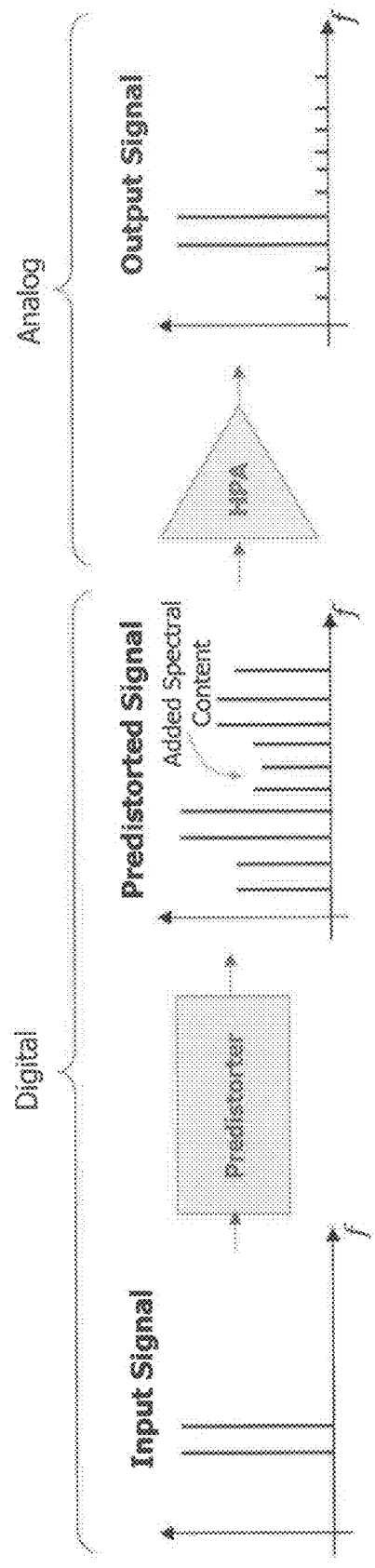
FIG. 1B depicts linearization in RF transmitting, or pre-distortion.

Digital linearization offers a more robust, modular, larger bandwidth, higher efficiency, and lower cost solution in part due to current advances in high speed digitization and digital processing in FPGAs and microprocessors. In general, there are two ways in which digital linearization is implemented, depending on the use-case: for transmit or for receive. When using linearization in a receiver, it is referred to as nonlinear equalization or post-distortion. This scheme is illustrated in FIG. 1A. On the other hand, when transmitting, linearization is known as pre-distortion. This is illustrated in FIG. 1B. Digital linearization takes an "analog" problem and solves it in the "digital" domain.

A main objective of the system of the present disclosure is to utilize the recent advances in configurability of hardware and digital methods to self-model and linearize nonlinear analog channels using only reconfigurable hardware without the need for controlled test environments. The system has uses in system identification of model coefficients, equalization for receive signals, pre-distortion for transmit signals, and the like. These are illustrated in the block diagrams in at least FIGS. 2, 4, 7, 10, and 11.

Referring to FIG. 1A, linearization in RF receiving, or equalization is shown. More particularly, there are several high power adversarial interfering signals in a frequency band, where there is also a low power signal of interest. These interferers drive the low noise amplifier (LNA) to its nonlinear region, causing distortion and spectral regrowth, thereby masking the desired signal. However, if a theoretical nonlinear digital equalizing filter could be realized, it would eliminate the distortion and unmask the desired signal.

Referring to FIG. 1B, linearization in RF transmitting, or pre-distortion is shown. More specifically, instead of targeting the LNA, as is done with equalization, the high power amplifier (HPA) is linearized. In this case, an input signal is distorted in such a way that when it is inserted into the HPA, all of the added spectral content cancels out what would have been seen on the output, thus producing a clean output signal above the saturation point of the amplifier.

Initial research was conducted to determine how to best model a nonlinear system, understanding that the system of interest can consist of a single amplifier up to a cascade of amplifiers, filters, and mixers. In one model, an input signal goes through a "black box" and the output contains gain and nonlinear distortion. The objective of the modeling step was to determine a proper transfer function, $H\{-\}$, where $y[n]=H\{x[n]\}$.

In narrowband analog RF systems, it is sufficient to approximate this nonlinear system with a Taylor series expansion. AM-AM and AM-PM characteristics are well-defined in this case; for every given input amplitude, there is a unique amplitude and phase output. However, a wideband nonlinear system may not have a one to one mapping for amplitude and phase as seen with narrowband systems. To address this situation, the concept of memory was introduced. Memory is observed in a system that contains a non-uniform frequency response across a band of interest, caused by linear filters and/or parasitic reactances in transistor devices.

There are numerous ways to model a nonlinear system with memory. Starting with the most basic models, it is possible to gain intuition about the more general types. Initial work started with a "box" model. Box models were developed by cascading a memoryless nonlinearity with linear and time-invariant filters. The most common arrangements are the Wiener, Hammerstein, and Wiener-Hammerstein models.

It is possible to derive expressions for these models, but the most general type of nonlinear model is referred to as the discrete truncated Volterra series expansion, and it is based on the "box" models above. The expression is shown below:

$$y[n] = h_0 + \sum_{m_1=0}^{N-1} h_1[m_1]x[n-m_1] + \sum_{p=2}^{P}\sum_{m_1=0}^{N-1}\cdots\sum_{m_p=0}^{N-1} h_p[m_1,\ldots,m_p]x[n-m_1]\ldots x[n-m_p], \quad (4)$$

where P is the order of the expansion, N is the amount of "analog" memory, and $h_p$ is the Volterra kernel.

The truncated Volterra series considers all unique combinations of products of discretely delayed signal inputs dictated by the total memory in the system and can model orders up to p. It is possible to specialize this equation to show that it is based on the memoryless nonlinearity and linear filtering box models above. For example, if the order, P, is set to one, with arbitrary memory, N, and the constant ($h_0$) set to zero, the equation simplifies to the expression for a linear filter.

$$y[n] = \sum_{m_1=0}^{N-1} h_1[m_1]x[n-m_1]$$

As a second example, if one sets the memory, N, to one, with arbitrary order, P, the equation simplifies to a Taylor series expansion plus a constant.

$$y[n] = \sum_{p=0}^{P} h_p x^p[n]$$

While the Volterra series is considered to be the most general model and can approximate many different types of nonlinear systems, it requires numerous coefficients and can be computationally difficult to implement in software/hardware. The total amount of coefficients in the equation above is $O(N^P)$, but there are several methods that can be used to reduce this number without significant reduction in modeling ability.

The method used herein to reduce the number of coefficients writes the Volterra kernel in triangular form. There are no approximations applied in this technique, as it relies on eliminating redundant coefficients in the expression. To illustrate this point, a rationale is provided below.

Given the $p^{th}$ order term shown below, and expanding the expression, one would notice $N^P$ permutations of a product of the input signal with arbitrary delays.

$$h_p[x[n]] = \sum_{m_1=0}^{N-1}\cdots\sum_{m_p=0}^{N-1} h_p[m_1,\ldots,m_p]\overbrace{x[n-m_1]\ldots x[n-m_p]}^{N^P \text{ permutations w/ repetition}}$$

It is possible to eliminate these repetitions by combining all of these terms' coefficients into one. A simplified version of the $p^{th}$ order term is written below.

$$h_p[x[n]] = \sum_{m_1=0}^{N-1}\cdots\sum_{m_p=m_{p-1}}^{N-1} h_{p,tri}[m_1,\ldots,m_p]x[n-m_1]\ldots x[n-m_p], \quad (5)$$

where $h_{p,tri}[m_1,\ldots,m_p] = \frac{1}{|\pi[m_1,\ldots,m_p]|}\sum_{\pi(\cdot)} h_p[m_{\pi(1)},\ldots,m_{\pi(p)}]$ Re-writing the entire series in this form only requires $O(_P{}^{M+P-1})$ coefficients.

To illustrate how significant this improvement is, Table 1 below compares the growth in coefficients for a system with memory depth of 5 and order from 1 to 5 for the general Volterra series expansion and the simplified "triangular" version.

TABLE 1

Coefficient growth for systems with Memory Depth 5.
N = 5

| p | General | Triangular |
|---|---------|------------|
| 1 | 5       | 5          |
| 2 | 25      | 15         |
| 3 | 125     | 35         |
| 4 | 625     | 70         |
| 5 | 3125    | 126        |

As shown above, when the order of the system is 5, there is more than an order of magnitude reduction in coefficients. For larger orders and memory depths, the reduction of coefficients, and thus computational complexity, is even more significant. The reduction in coefficients tends to 1/p! as N goes to ∞.

The truncated Volterra series is commonly written in vector representation within literature. This form organizes the Volterra kernel coefficients and products of delayed signal inputs into their own respective vectors. Below is an example of a quadratic triangular Volterra series expansion written in vector form:

$$\vec{H}=[h_0,h_1[0],h_1[1],\ldots h_1[N-1],h_2[0,0],h_2[0,1],\ldots$$
$$h_2[0,N-1],h_2[1,1]\ldots,h_2(1,N-1),\ldots,h_2[N-1,N-1]]$$

$$\vec{X}[n]=[1,x[n],x[n-1],\ldots x[n-N+1],x[n]^2,x[n]x[n-1],\ldots x[n]x[n-N+1]x[n-1]^2,\ldots x[n-1]x[n-N+1],\ldots,x[n-N+1]^2]$$

$$y[n]=\vec{H}^T\vec{Y}[n] \qquad (6)$$

It is possible to see how much clearer the vector representation is. While the example above is shown for a quadratic system, it is straightforward to write higher order expansions in this form. Lastly, it is important to note that this representation is commonly employed when discussing adaptive filtering, not only because it is clearer to interpret, but also more suitable for implementing in MATLAB, in hardware, and the like.

Due to the generality of the model used to represent numerous nonlinear systems, the opportunity to reduce the total number of coefficients in the kernel, and the simplicity of its vector representation, the Volterra series expansion was chosen as one system model for the present disclosure. However, this embodiment is not limited only to Volterra models, as other nonlinear models and look-up tables can be implemented in the digital signal processing as well.

In certain embodiments of the system, adaptive filtering is used. In general, adaptive filtering iteratively minimizes a convex cost function of an estimation error signal to obtain optimal coefficients of a known system model. Initially, several techniques were used: Least Mean Square (LMS), Conventional Recursive Least Square (CRLS), and dither linear search (DLS). In certain embodiments, CRLS is preferred because of its accuracy.

The stochastic gradient algorithm, in conjunction with all learning architectures, used in this work is the exponentially-weighted conventional-recursive-least-square method (CRLS). The CRLS algorithm is the exact solution to the stochastic gradient method, as it does not require any a-priori knowledge of the statistics of the signal. The cost function associated with this filter is shown below:

$$J[n]=\sum_{k=1}^{n}\lambda^{n-k}\left(y[k]-\vec{H}^T X[k]\right)^2,$$

where λ is the algorithm memory, y is an output sample, H is the vectorized kernel, and X is the vectorized input. This cost function is an exponentially weighted average of the error, which is controlled by the "forgetting" factor, λ. The forgetting factor value ranges from 0 to 1; the value is chosen closer to 0, when the statistics of the signal are rapidly changing and is chosen closer to 1 when the statistics are slowly varying.

Inverse coefficient estimation can be accomplished using two common methods. The first is the $p^{th}$ order inverse, which carries with it some assumptions and is an analytical solution. The second uses adaptive learning architectures, which do not carry any assumption and are an optimal solution. In certain embodiments of the system of the present disclosure, adaptive learning is used because it is simplest to implement and arrives at an optimal solution.

As mentioned above, the current advancement in linearization is due largely to the recent developments in reconfigurable hardware and software defined radios available on the market. Algorithmic verification and simulation was tested on a highly reconfigurable, multi-channel analog device by Applicant, in conjunction with the Ettus Research™ USRP, which comprises the digital components of the system.

Any similar set of devices can be used that comprise at least two independent receive channels for equalization, at least one receive and one transmit channel for pre-distortion, and at least two receive and one transmit for concurrent equalization and pre-distortion. Additionally, a switch matrix and variable attenuation will be required for this multi-channel linearization approach. Lastly, to support the digital algorithm, independent digital to analog converters (DAC), analog to digital converters (ADC) and a microprocessor, FPGA, or the like is required for the adaptation of nonlinear model coefficients.

Figure 10:
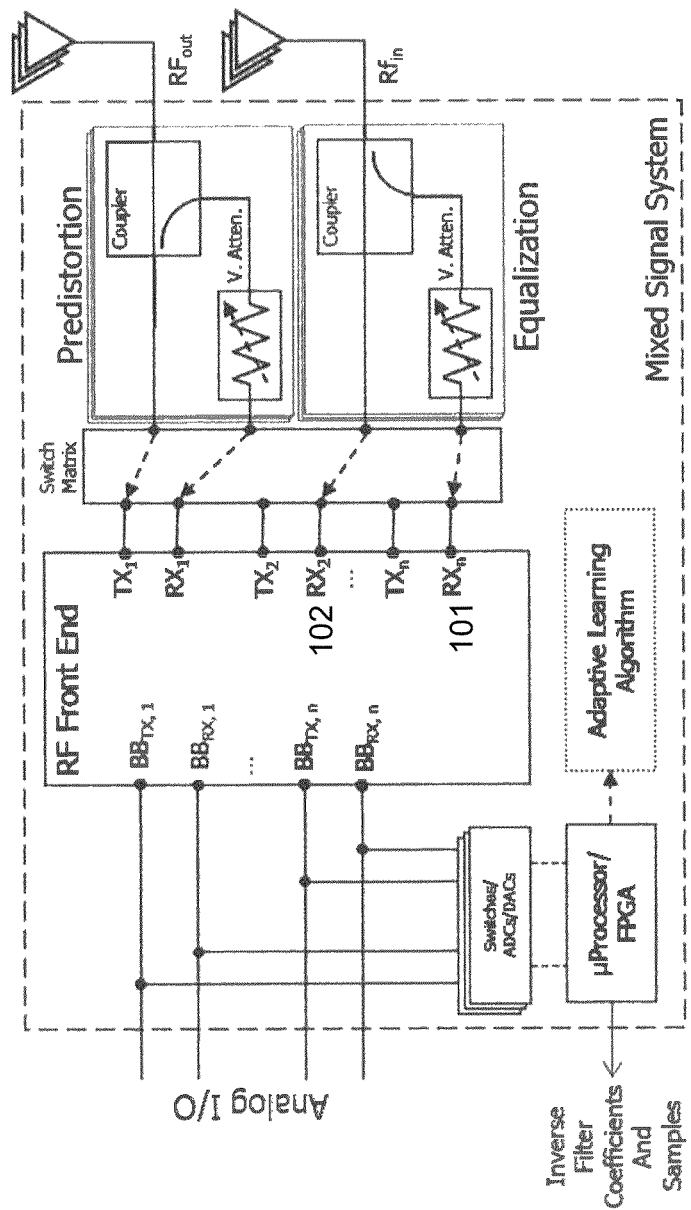
FIG. 10 shows one embodiment of the system of the present disclosure for adaptively obtaining coefficients of an inverse model for both equalization and pre-distortion for a multi-channel RF system.
Figure 11:
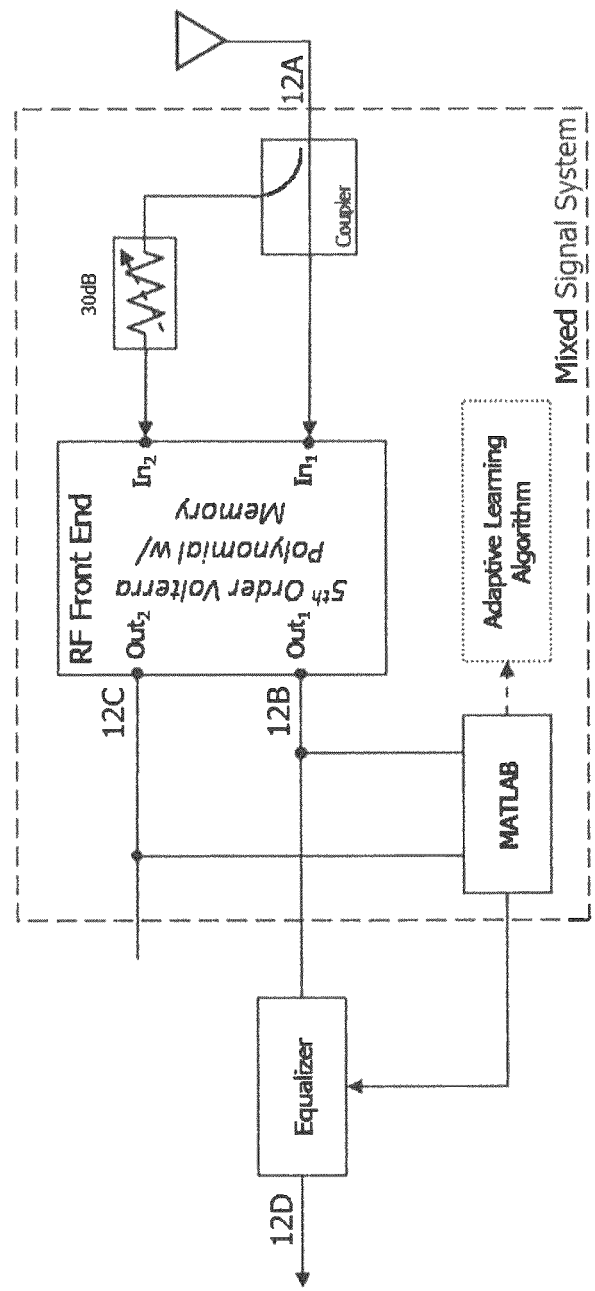
FIG. 11 shows one embodiment of the system of the present disclosure for adaptively obtaining coefficients of an inverse model for equalization and pre-distortion for an RF system.

FIGS. 10 and 11 show configurable architectures for linearization. There have been simulations which show how these systems operate. Initial results show that linearization is possible with a reconfigurable device by conventional methods, and that with this new architecture it can be done in real-time without the need for extra analog hardware.

In certain embodiments of the present system, the filters are implemented in C++ to run seamlessly with USRP Hardware Driver API. In some cases, the learning architectures are implemented in firmware for applications that require real-time performance. In testing environments, deferred processing can take place, implementing the digital filtering and adaption with scripting tools such as Python, MATLAB, and the like.

Note, the power measurements in the data presented in the figures below were not taken with calibrated test equipment, but it is still useful to observe the spectral regrowth and its relative power level to the fundamentals as well as the general shape of the spectrums generated, even though the absolute power levels may be different.

Figure 2:
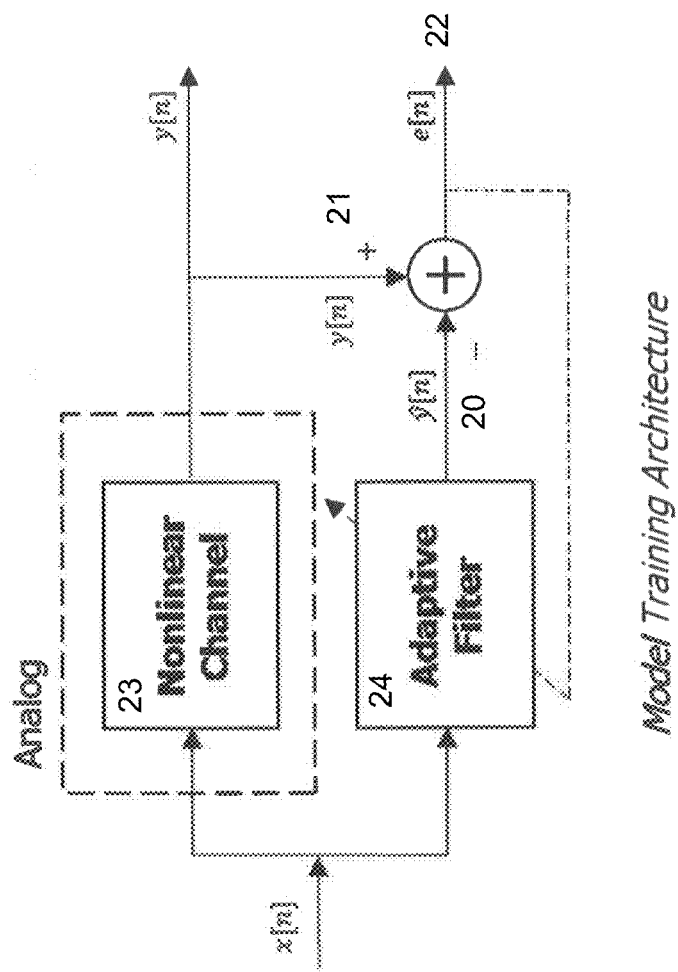
FIG. 2 shows one embodiment of the system of the present disclosure for use in system identification.

Referring to FIG. 2, a high level algorithm block diagram of the present disclosure for use in system identification is shown. System identification is the process by which the coefficients of a nonlinear transfer function are learned. More specifically, an estimated output 20, ŷ[n], is subtracted from the actual output from the channel 21, y[n], to obtain an error signal 22, e[n], which is then used to adapt a nonlinear digital filter. The nonlinear channel block 23 can be a cascade of various nonlinear analog devices, including but not limited to amplifiers, filters, and mixers. The adaptive filter 24 and summation is implemented digitally in software or firmware. This block diagram and results below are shown to illustrate the effectiveness of equalization as it may apply to the system architecture proposed in this disclosure; however, these results were not obtained via the multi-channel architecture shown in FIG. 10. The results below were obtained via conventional digital linearization methods.

Figures 3A, 3B, 3C:
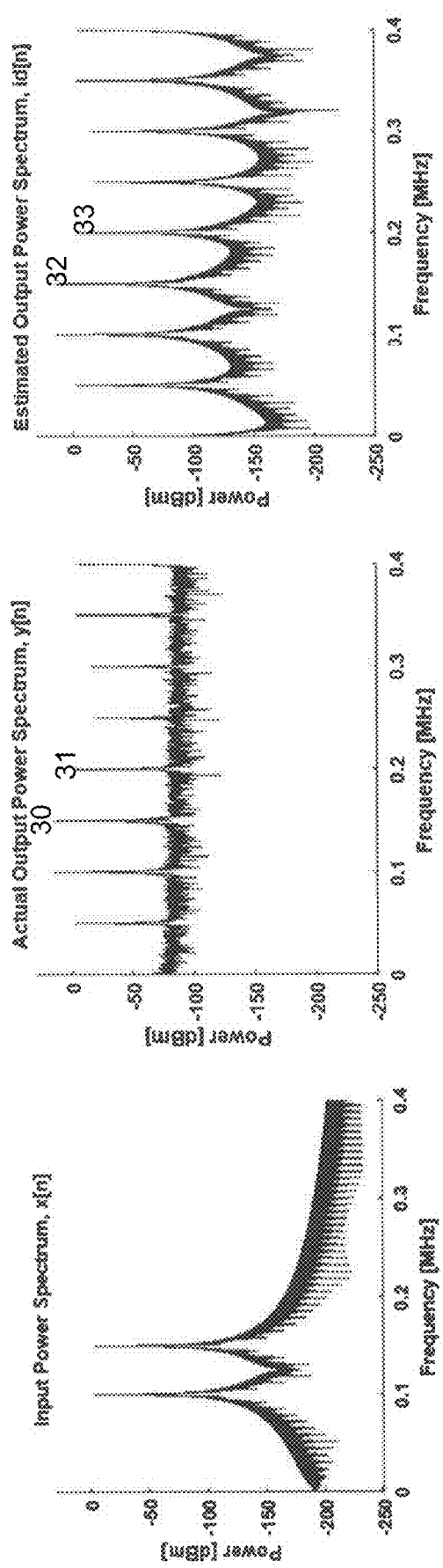
FIG. 3A shows a modeled input power spectrum for the embodiment shown in FIG. 2.
FIG. 3B shows an actual output power spectrum for the embodiment shown in FIG. 2.
FIG. 3C shows a noise-less modeled output power spectrum for the embodiment shown in FIG. 2.

Referring to FIG. 3A, a modeled input power spectrum for the embodiment shown in FIG. 2 is shown. More specifically, a noiseless and pulsed two tone signal is generated for insertion into a nonlinear and noisy analog channel.

Referring to FIG. 3B, an actual output power spectrum for the embodiment shown in FIG. 2 is shown. More specifically, spectral regrowth and a noise floor are observed due to the analog nonlinear channel. The highest fundamental 30, $f_2$, had an estimated power of 15.11 dBm in the actual output spectrum and the IM3 31 (third-order intermodulation product) was estimated to be −3.28 dBm for this input signal.

Referring to FIG. 3C, an estimated output power spectrum for the embodiment shown in FIG. 2 is shown. More specifically, after inserting the unmodified input signal into the digital filter after learning, the estimated output, $\hat{y}[n]$ or , id[n], matches the actual output, y[n]. The highest fundamental 32, $f_2$, had an estimated power of 15.12 dBm in the actual output spectrum and the IM3 33 (third-order intermodulation product) was estimated to be −3.28 dBm. The Volterra model matched the actual results and demonstrates that the algorithm is robust to noise.

Figure 4:
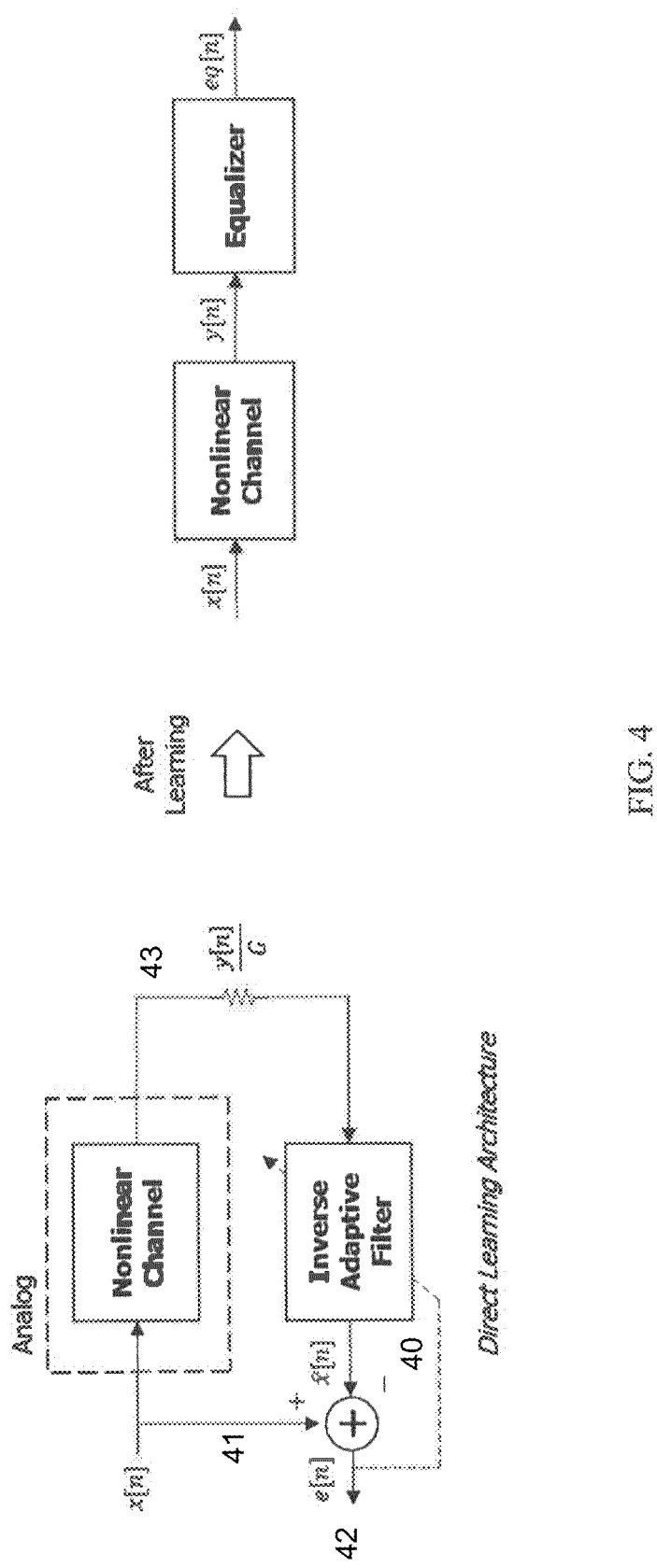
FIG. 4 shows one general embodiment of the system of the present disclosure for use in equalization for receivers.

Referring to FIG. 4, a high level algorithm block diagram of the present disclosure for use in equalization for receivers is shown. Digital equalization is implemented to remove nonlinear distortion from a received signal. More specifically, an estimated input 40, $\hat{d}[n]$, is subtracted from the actual input to the channel 41, x[n], to obtain an error signal 42, e[n], which is then used to adapt a nonlinear inverse digital filter. After the direct learning step has occurred, equalization is conducted. This block diagram and results illustrate the effectiveness of equalization as it may apply to the system architecture proposed in this disclosure. The results below were obtained via conventional digital linearization methods.

Still referring to FIG. 4, the diagram shows the general method of how equalization and learning an inverse is done. Typically, a more linear receiver/digitizer is used to characterize the TX/RX channel under test. In one embodiment of this disclosure, we used two of the same channels, one with greater attenuation (less sensitivity, but in the linear regime of operation) than the more sensitive, but nonlinear channel to implement the DLA (direct learning architecture). For example, when looking at FIG. 10, 101 $RX_n$ approximates 41 x[n] and 102 $RX_2$ is 43 y[n].

Figures 5A, 5B, 5C:
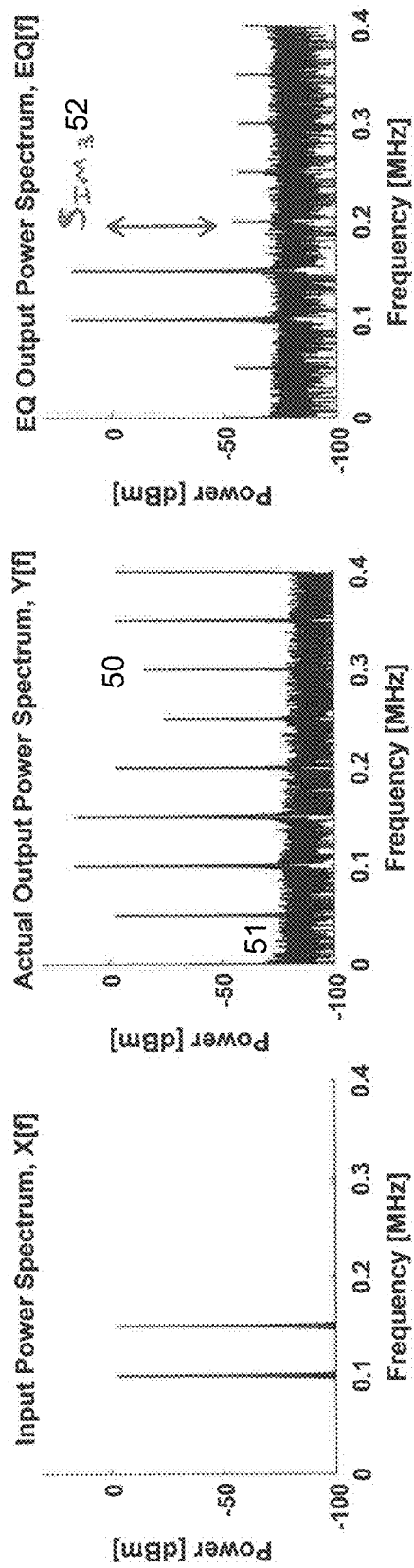
FIG. 5A shows a modeled input power spectrum for one embodiment of the system.
FIG. 5B shows an actual output power spectrum for the embodiment shown in FIG. 4.
FIG. 5C shows an equalized output power spectrum for the embodiment shown in FIG. 4.

Referring to FIG. 5A, a modeled input power spectrum for the embodiment shown in FIG. 4 is shown. More specifically, a two-tone, pulsed, noiseless signal was used as the test signal for the equalization algorithm.

Referring to FIG. 5B, an actual output power spectrum for the embodiment shown in FIG. 4 is shown. More specifically, spectral regrowth 50 and a noise floor 51 is observed due to the analog nonlinear channel.

Referring to FIG. 5C, an equalized output power spectrum for the embodiment shown in FIG. 4 is shown. More specifically, significant suppression of 52 IM3 is achieved after the equalization filter. In some cases, there is approximately 50 dB of IM3 suppression.

Figure 6:
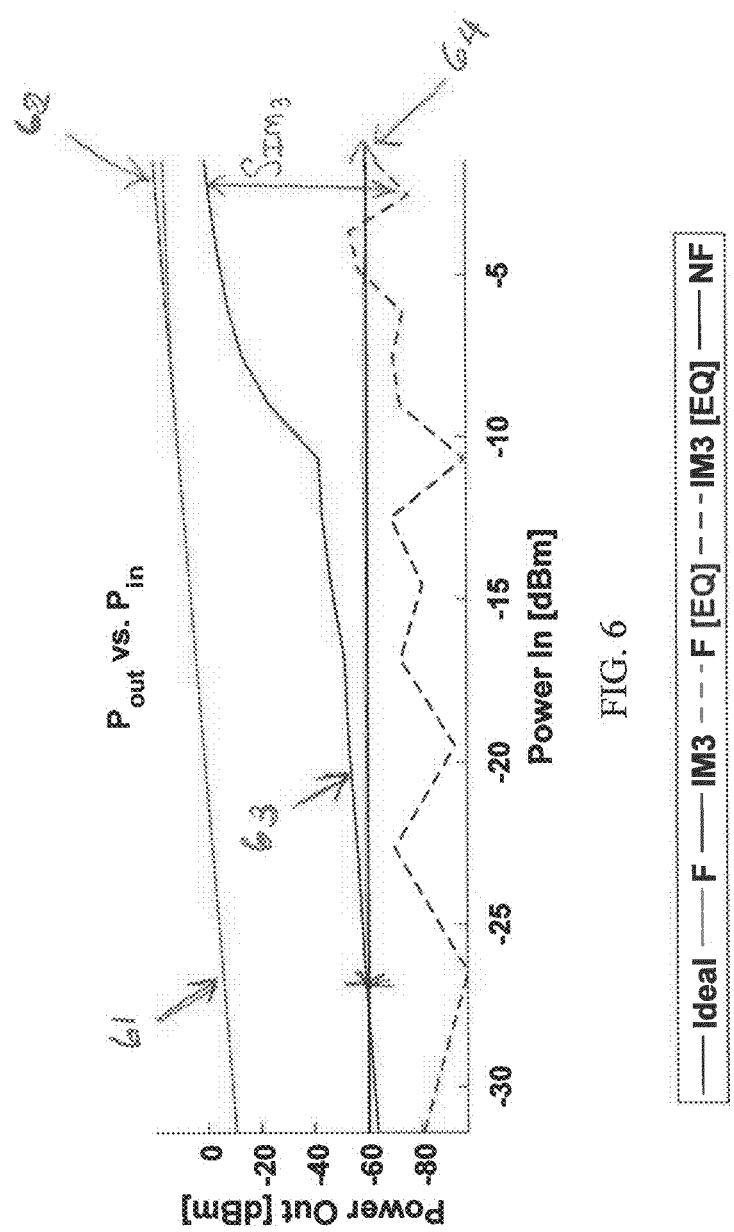
FIG. 6 shows a plot of power out vs. power in for the equalization embodiment shown in FIG. 4.

Referring to FIG. 6, a plot of power out vs. power in for the embodiment shown in FIG. 4 is shown. More specifically, the fundamental ($f_2$) is shown 61 as is the IM3 63 ($2*f_2-f_1$). As can be seen in the plot, the suppression of IM3 is about 50 dBm and the AM-AM distortion is removed 62. The dynamic range has also been increased significantly 64. There were almost no nonlinearities after equalization.

Figure 7:
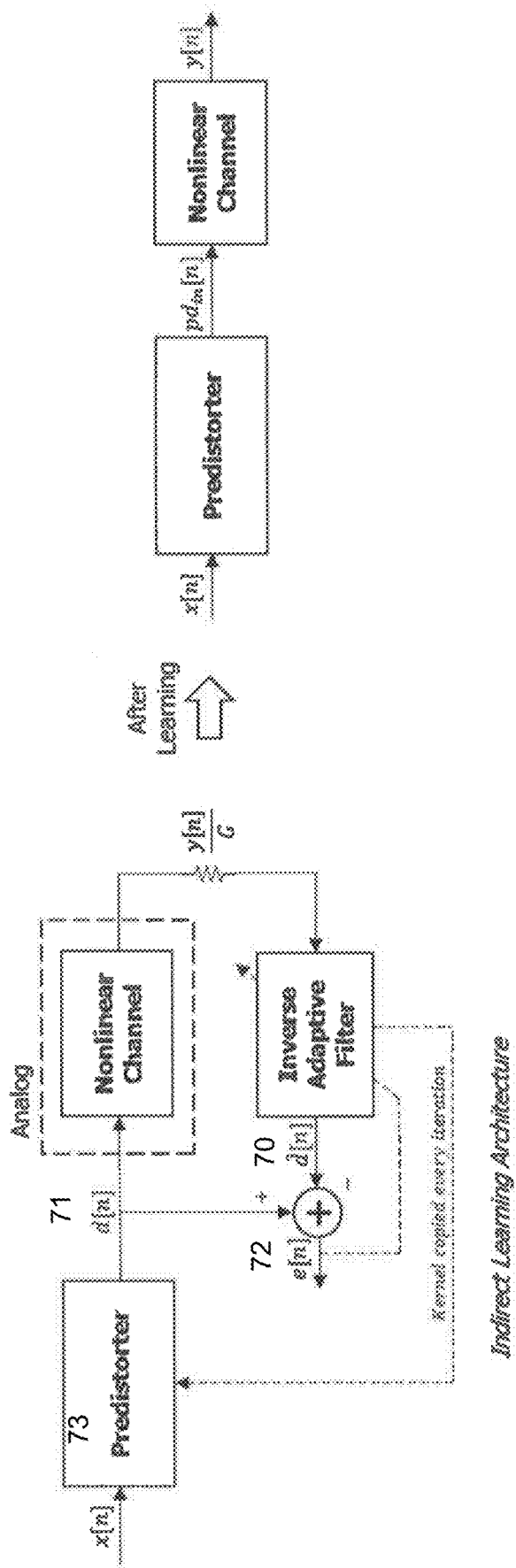
FIG. 7 shows one high level embodiment of the system of the present disclosure for use in pre-distortion for transmitters.

Referring to FIG. 7, a high level algorithm block diagram of the present disclosure for use in pre-distortion for transmitters is shown. Digital pre-distortion (DPD) is implemented when reduction in harmonics or intermodulation products is required in a transmitter. More specifically, an estimated pre-distorted input 70, $\hat{d}[n]$, is subtracted from the actual pre-distorted input 71, d[n], to obtain an error signal 72, e[n], which is then used to adapt a nonlinear inverse digital filter. After indirect learning step has occurred, the next iteration of kernel is copied to the pre-distorter block 73. Once convergence criteria have been met, the system forgoes the indirect learning steps. Because of the latency inherent in the UDP packet transfer with the tested implementation using the Ettus Research™ USRP, signal-by-signal batch iterations were used with the SDR as opposed to sample-by-sample iterations. For example, a signal of length-N was inserted into the pre-distortion system, and the inverse adaptive filter learned a pre-distortion kernel without copying it to the pre-distortion block after each sample-by-sample iteration, but alternatively, copied the new kernel after processing the full length-N signal. In the results shown below, three batch iterations, 1 ms pulses, and 10 MSPS sampling was used.

Figures 8A, 8B, 8C:
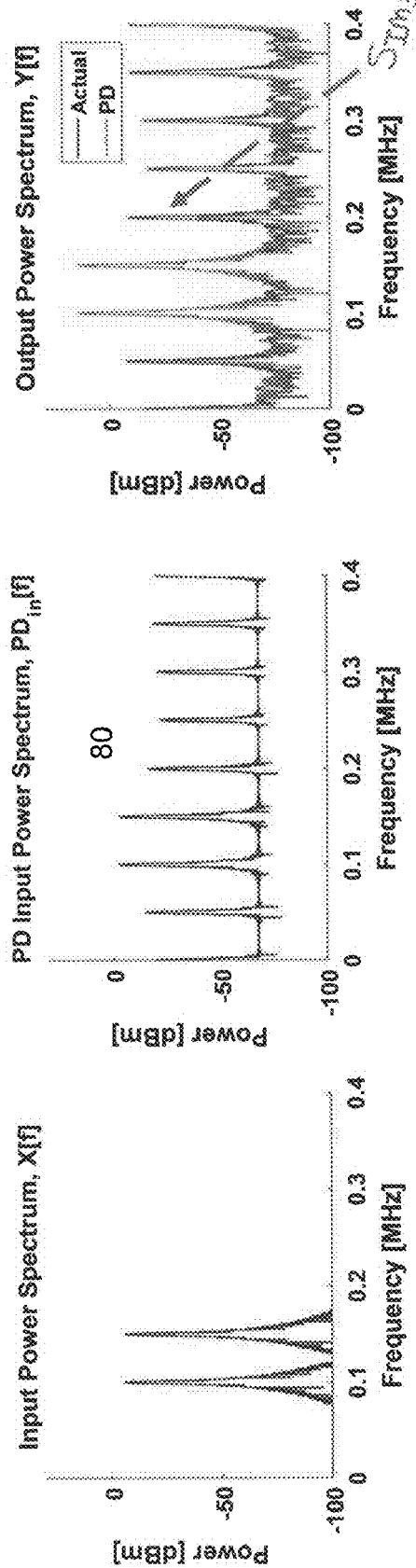
FIG. 8A shows a modeled input power spectrum for the embodiment shown in FIG. 7.
FIG. 8B shows a pre-distortion input power spectrum for the embodiment shown in FIG. 7.
FIG. 8C shows a modeled output power spectrum for the embodiment shown in FIG. 7.

Referring to FIG. 8A, a modeled input power spectrum for the embodiment shown in FIG. 7 is shown. More specifically, a two-tone, noiseless signal was used as the test signal for the equalization algorithm.

Referring to FIG. 8B, a pre-distortion input power spectrum for the embodiment shown in FIG. 7 is shown. More specifically, this is what the two tone signal looks like after pre-distortion, d[n], after the predistortion kernel was learned. Notice the considerable spectral regrowth 80 generated to be inserted and canceled out in the nonlinear channel.

Referring to FIG. 8C, an output power spectrum for the embodiment shown in FIG. 7 is shown. More specifically, two plots are overlaid on each other which show the signal output before pre-distortion occurred and the signal output with pre-distortion, y[n]. There, greater than 30 dB cancellation of 81 IM3 was shown.

Figure 9:
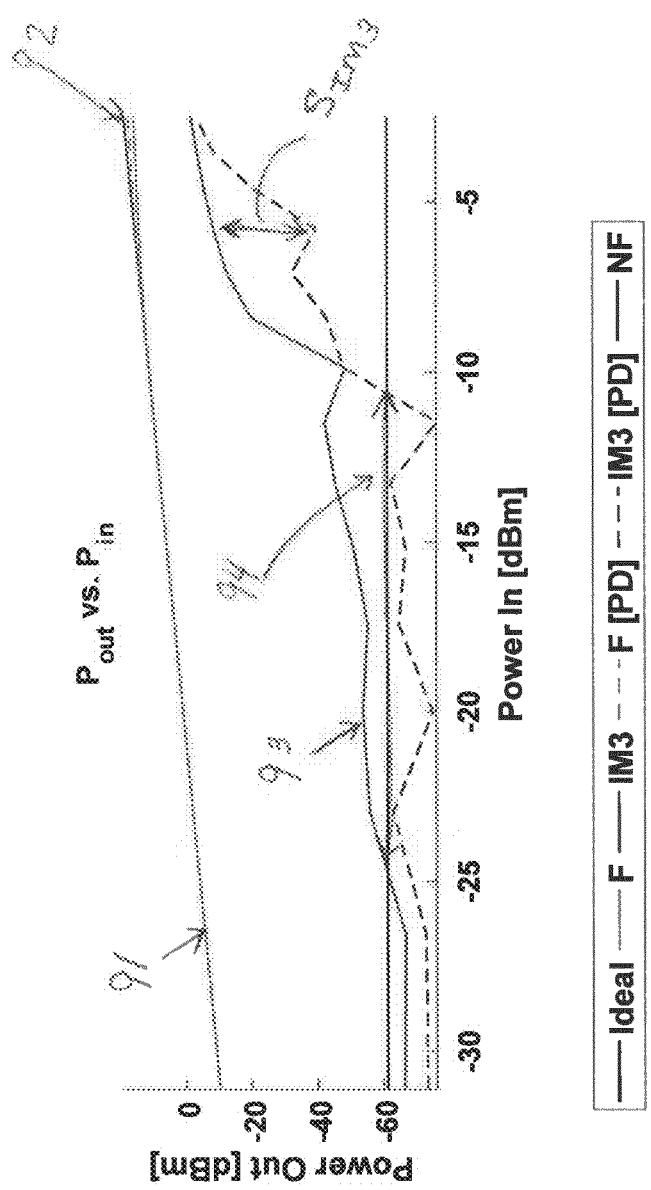
FIG. 9 shows a plot of power out vs. power in for the pre-distortion embodiment shown in FIG. 7.

Referring to FIG. 9, a plot of power out vs. power in for the embodiment shown in FIG. 7 is shown. More specifically, the highest-frequency fundamental ($f_2$) is shown 91 as is the IM3 93 ($2*f_2-f_1$). As can be seen in the plot, the suppression of IM3 is about 30 dBm and the AM-AM distortion is reduced 92. The dynamic range has also been increased 94. There was significant suppression of IM3 across input power seen with the pre-distortion.

Referring to FIG. 10, one embodiment of the system of the present disclosure for adaptively obtaining coefficients of an inverse model for both equalization and pre-distortion for a multi-channel and reconfigurable RF system is shown. In certain embodiments, the system works by comparing a less sensitive (but more linear) signal observation with a more sensitive (but nonlinear) signal observation to produce a signal that is both linear and sensitive. This can be implemented with one antenna feed and coupler as shown or with two separate antenna feeds. The system preforms real-time learning and adaption and does not require training sets. In some cases, the system learns new coefficients across time and transient changes in performance. The hardware required to implement such a system is common in reconfigurable RF systems. In addition to the RF front end that needs linearization, the analog subsystem includes couplers and variable attenuators, in one embodiment. As shown, there are digital components required, comprising of ADCs, DACs, microcontrollers and/or FPGAs. The adaptive learning algorithm can be implemented with digital logic requiring inputs from the analog subsystem. This general embodiment can be modified for specific applications and hardware systems.

Certain embodiments of this system have the ability to learn inverse nonlinear model coefficients or create look-up tables for nonlinear self-characterization and self-linearization. The system works by comparing a less sensitive and more linear signal observation with a more sensitive but nonlinear signal observation to produce a linear and sensitive signal. This architecture benefits from the assumption that the high power interfering signals near a low power desired signal are what contributes to the nonlinear operation of the front end, and if this assumption is broken then performance of the system will be degraded.

Referring to FIG. 11, one embodiment of the system of the present disclosure for adaptively obtaining coefficients of an inverse model for equalization for an RF system is shown. More specifically, this embodiment is a more specific embodiment of FIG. 10, which shows equalization of a single channel using two receive channels. Here, a sensitive and nonlinear channel coupled with a heavily attenuated and desensitized channel can be processed to learn an inverse filter for equalization. To verify functionality, a MATLAB model of this system was realized with results shown below.

Figure 12A:
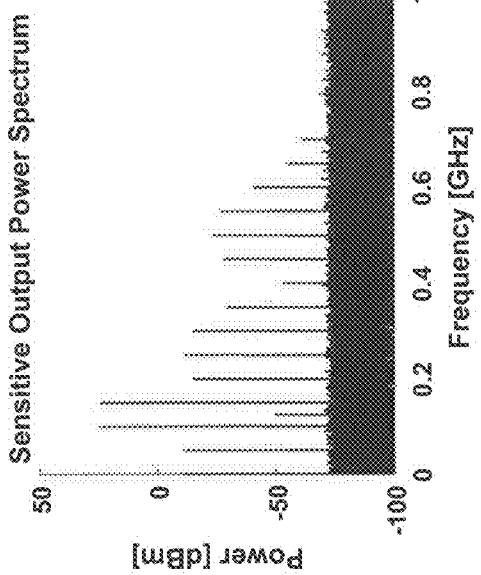
FIG. 12A shows an input power spectrum for the embodiment shown in FIG. 11.

Referring to FIG. 12A, an input power spectrum for the embodiment shown in FIG. 11 is shown. More specifically, two interferers 120, 121 surround a lower power desired signal 122 at the antenna. The low power desired signal is set to be 70 dB below the interfering signal pair.

Figure 12B:
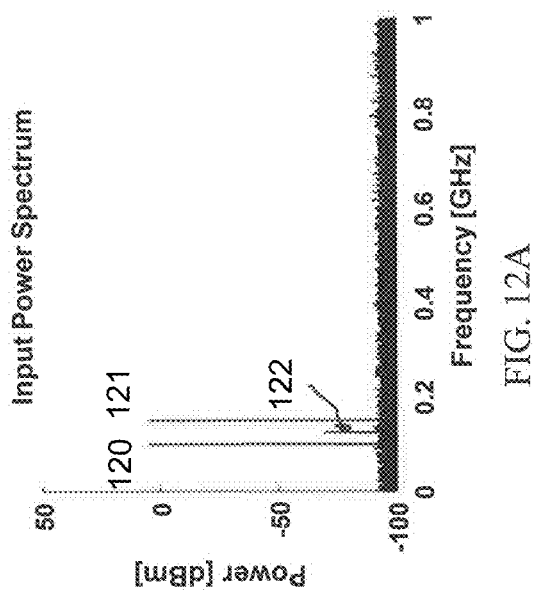
FIG. 12B shows a sensitive output power spectrum for the embodiment shown in FIG. 11.

Referring to FIG. 12B, a sensitized output power spectrum for the embodiment shown in FIG. 11 is shown. More specifically, this spectrum is what would be seen if there was no filtering and linearization on the traditional RF receive channel with an LNA who's linear operating point was below the summed power level of the interferers. As a result, the dynamic range of the system is significantly reduced and there would be significant distortion on the desired signal if no filtering were applied. While there is added spectral content, the desired signal can still be seen in the spectrum.

Figure 12C:
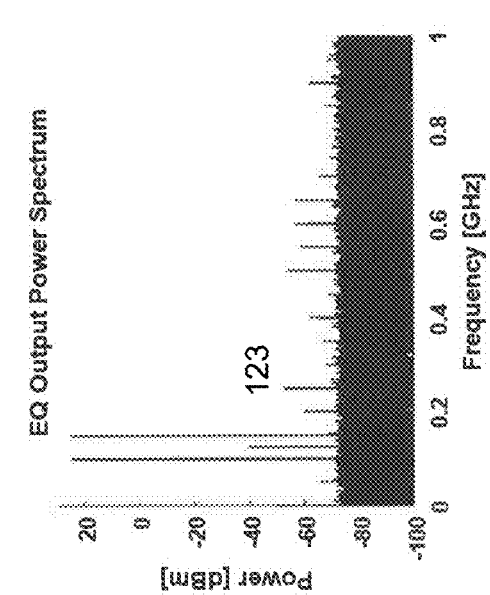
FIG. 12C shows a desensitized output power spectrum for the embodiment shown in FIG. 11.

Referring to FIG. 12C, a desensitized output power spectrum for the embodiment shown in FIG. 11 is shown. More specifically, a 30 dB attenuator was applied before the input to a secondary independent analog receive channel. This results in added noise figure, thus desensitizing the received signal path. Although the channel is operating in its linear region, the desired signal cannot be observed because it is under the noise floor.

Figure 12D:
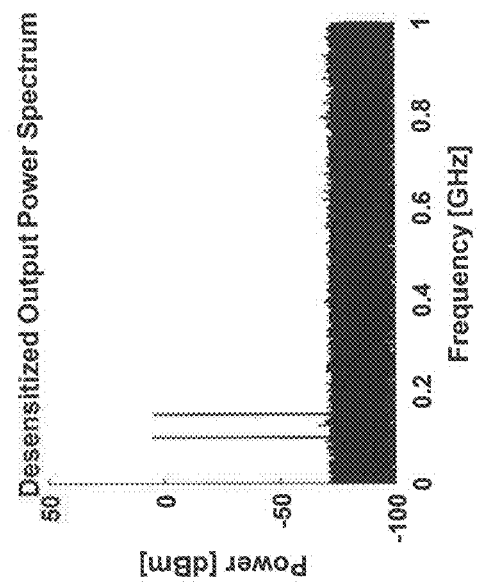
FIG. 12D shows an equalized output power spectrum for the embodiment shown in FIG. 11.

Referring to FIG. 12D, an equalized output power spectrum for the embodiment shown in FIG. 11 is shown. More specifically, after the equalization filter is applied, there is about 41.7 dB improvement on the worst intermodulation product 123 found in the spectrum which appears at 250 MHz. The desired signal is above any spurious product that was generated by the RF front end.

Figure 13A:
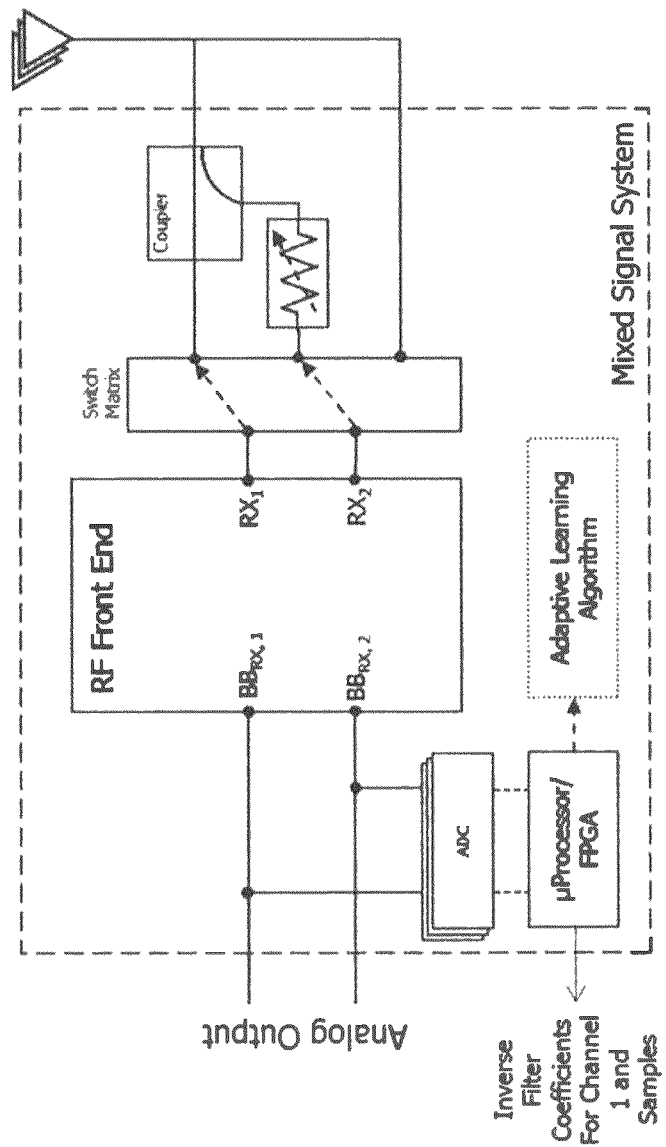
FIG. 13A shows a first state of an embodiment used for multi-channel equalization using minimal hardware.

Referring to FIG. 13A, a first state of an embodiment used for multi-channel equalization using minimal extraneous hardware is shown. More specifically, this hardware configuration state is used to adapt nonlinear inverse filter coefficients for the first receive channel.

Figure 13B:
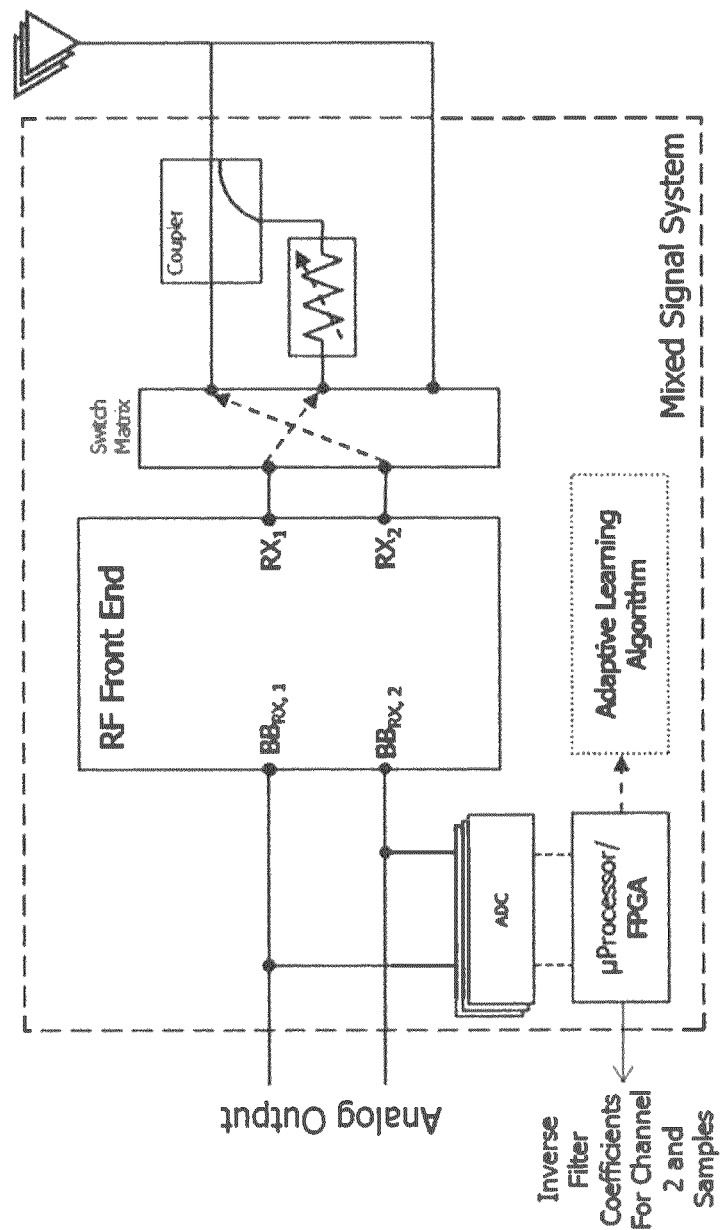
FIG. 13B shows a second state of an embodiment used for multi-channel equalization using minimal hardware.

Referring to FIG. 13B, a second state of an embodiment used for multi-channel equalization using minimal hardware is shown. More specifically, this hardware configuration state is used to adapt nonlinear inverse filter coefficients for the second receive channel.

Figure 13C:
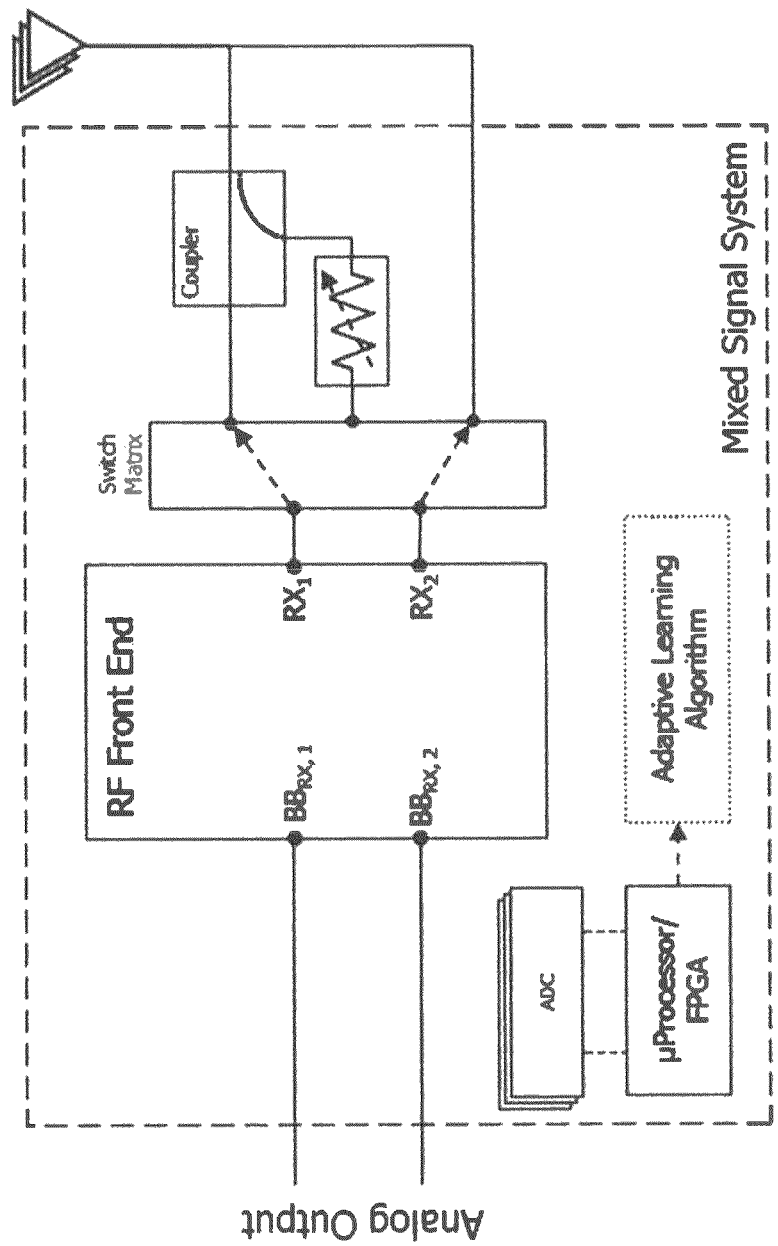
FIG. 13C shows a third state of an embodiment used for multi-channel equalization using minimal hardware.

Referring to FIG. 13C, a third state of an embodiment used for multi-channel equalization using minimal hardware is shown. More specifically, this hardware configuration state is used once the nonlinear inverse filter coefficients for both receive channels have converged and adaptations are no longer needed. Future adaptations can occur on a time schedule, if there are changes in the environment (e.g., temperature, RF activity, and the like), or in any other time increment based on the application.

TABLE 2

Pre-distortion results for one embodiment of the system.

| Parameter | Specification | Measured | Condition |
|---|---|---|---|
| OIP3 | >10 dB improv. | 15 dB | Linear Region ($P_{in}$ = −13 dBm) |
| THD | >12 dB improv. | 20 dB | P1dB ($P_{in}$ = 0 dBm) |
| SFDR | >15 dB improv. | 15 dB | Single/Dual Tone Signal |
| EVM | >10 dB improv. | >25/15 dB | BFSK and QPSK/16-QAM (Sat.) |

TABLE 3

Equalization results for one embodiment of the system.

| Parameter | Specification | Measured | Condition |
|---|---|---|---|
| OIP3 | >10 dB improv. | 10.22 dB | Linear Region (Pin = −11.08 dBm) |
| THD | >12 dB improv. | 38.78 dB | P1dB (Pin = 4.5 dBm) |
| SFDR | >15 dB improv. | 22/20 dB | Single/Dual Tone Signal |
| EVM | >10 dB improv. | >25 dB | BFSK, QPSK/16-QAM (Sat.) |

The tables above show example measured results for the embodiments shown in FIGS. 2, 4, and 7 for various signal types, including analog modulation and digital communication signals. Similar performance is expected for the embodiments shown in FIGS. 10 and 11.

It is to be understood that, because some of the constituent system components and method steps depicted in the accompanying Figures may be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

It is to be understood that the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

While various embodiments of the present invention have been described in detail, it is apparent that various modifications and alterations of those embodiments will occur to and be readily apparent to those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed:

1. A modular, multi-channel radio frequency (RF) calibration system comprising:
   at least two independent receive channels for equalization of the receive channels in the modular, multi-channel RF calibration system;
   a switch matrix configured for variable attenuation;
   at least one converter selected from the group consisting of digital-to-analog and analog-to-digital; and
   a microprocessor or field programmable gate array (FPGA) configured for adaptation of nonlinear model coefficients for real-time linearization of the modular, multi-channel RF calibration system without a look-up table (LUT).

2. The modular, multi-channel RF calibration system of claim 1, wherein the system provides third-order intermodulation product (IM3) suppression of greater than 10 dB and cancellation of other nonlinear distortion for the equalization.

3. The modular, multi-channel RF calibration system of claim 1, wherein the system predicts an operating point of an analog system.

4. The modular, multi-channel RF calibration system of claim 1, wherein the real-time linearization uses a numerical approximation technique of a truncated Volterra series or a triangular Volterra series.

5. A modular, multi-channel radio frequency (RF) calibration system comprising:
   at least one receive channel and at least one transmit channel for use in pre-distortion of the transmit channel of the modular, multi-channel RF calibration system;
   a switch matrix configured for variable attenuation;
   at least one converter selected from the group consisting of digital-to-analog and analog-to-digital; and
   a microprocessor or field programmable gate array (FPGA) configured for adaptation of nonlinear model coefficients for real-time linearization of the modular, multi-channel RF calibration system without a look-up table (LUT).

6. The modular, multi-channel RF calibration system of claim 5, wherein the system provides third-order intermodulation product (IM3) suppression of greater than 10 dB and cancellation of other nonlinear distortion for pre-distortion.

7. The modular, multi-channel RF calibration system of claim 5, wherein the system predicts an operating point of an analog system.

8. The modular, multi-channel RF calibration system of claim 5, wherein the real-time linearization uses a numerical approximation technique of a truncated Volterra series or a triangular Volterra series.

9. A modular, multi-channel radio frequency (RF) calibration system comprising:
   at least two independent receive channels and at least one transmit channel for use in concurrent equalization and pre-distortion of the modular, multi-channel RF calibration system;
   a switch matrix configured for variable attenuation;
   at least one converter selected from the group consisting of digital-to-analog and analog-to-digital; and
   a microprocessor or field programmable gate array (FPGA) configured for adaption of nonlinear model coefficients for real-time linearization of the modular, multi-channel RF calibration system without a look-up table (LUT).

10. The modular, multi-channel RF calibration system of claim 9, wherein the system provides third-order intermodulation product (IM3) suppression of greater than 10 dB and cancellation of other nonlinear distortion for both the equalization and pre-distortion.

11. The modular, multi-channel RF calibration system of claim 9, wherein the system predicts an operating point of an analog system.

12. The modular, multi-channel RF calibration system of claim 9, wherein the real-time linearization uses a numerical approximation technique of a truncated Volterra series or a triangular Volterra series.

* * * * *